US 6,617,058 B2

(12) United States Patent
Schier

(10) Patent No.: US 6,617,058 B2
(45) Date of Patent: Sep. 9, 2003

(54) CUTTING TOOL WITH A CARBONITRIDE COATING

(75) Inventor: Veit Schier, Leinfelden-Echterdingen (DE)

(73) Assignee: Walter AG, Tübingen (DE)

( * ) Notice: Subject to any disclaimer, the term of this patent is extended or adjusted under 35 U.S.C. 154(b) by 0 days.

(21) Appl. No.: 09/768,650

(22) Filed: Jan. 24, 2001

(65) Prior Publication Data
US 2001/0024598 A1 Sep. 27, 2001

(30) Foreign Application Priority Data
Jan. 24, 2000 (DE) .......................... 100 02 861

(51) Int. Cl.$^7$ ................................. B32B 9/00
(52) U.S. Cl. .................... 428/698; 51/307; 51/309; 428/216; 428/336; 428/699; 428/701
(58) Field of Search .............. 428/698, 699, 428/216, 336, 701; 51/307, 309

(56) References Cited

U.S. PATENT DOCUMENTS

| 4,619,865 A | * | 10/1986 | Keem et al. |
| 4,714,660 A | * | 12/1987 | Gates, Jr. |
| 4,746,563 A | * | 5/1988 | Nakano et al. |
| 4,758,280 A | * | 7/1988 | Bergmann et al. |
| 5,208,102 A | * | 5/1993 | Schulz et al. |
| 5,652,045 A | * | 7/1997 | Nakamura et al. |
| 5,958,569 A | * | 9/1999 | Leverenz et al. |
| 5,981,049 A | * | 11/1999 | Ohara et al. |
| 6,235,416 B1 | * | 5/2001 | Konig et al. |
| 6,254,984 B1 | * | 7/2001 | Iyori |
| 6,284,356 B1 | * | 9/2001 | Kiriyama |
| 6,436,519 B2 | * | 8/2002 | Holzschuh |

FOREIGN PATENT DOCUMENTS

| CA | 2023049 | * | 2/1991 |
| JP | 02022455 | * | 1/1995 |
| JP | 07173608 | * | 7/1995 |

OTHER PUBLICATIONS

English abstract of JP 2810225, no date.*

* cited by examiner

Primary Examiner—Archene Turner
(74) Attorney, Agent, or Firm—Frishauf, Holtz, Goodman & Chick, P.C.

(57) ABSTRACT

A cutting tool is provided, at least in certain areas, with a carbonitride coating, which acts to reduce friction and as a wear-protective layer. The coating is applied by means of a modified PVD process in that, for creating the carbonitride layer, carbon and nitrogen in the form of gas are introduced into the reaction chamber, and one or several ion sources are continued to be operated to form plasma.

17 Claims, 5 Drawing Sheets

CUTTING TOOL WITH A CARBONITRIDE COATING

BACKGROUND OF THE INVENTION

1. Field of the Invention

The invention relates to a cutting tool, or a part of a cutting tool, such as a cutter plate for machining, for example.

2. Description of Related Art processing other materials. For example, chips removed from the workpiece are deflected at the cutting edges and slide along the cutting surfaces under high pressure.

The wear conditions of the tool are indicated by defects of the cutting edge, as well as defects of the surface. On the one hand, the tool should have the greatest possible service life, but on the other hand it should provide the highest possible cutting output.

Cutting tools, which are provided with a wear-reducing coating, are known. The coatings have been produced by means of the CVD process (chemical vapor deposition) or by means of the PVD process (physical vapor deposition). EP 0 736 615 A2, for example, discloses a multi-layered coating with a total of four layers applied to a substrate. The layer directly adhering to the substrate is a layer of $TiC_x$-$N_yO_z$. The next following layer is preferably a titanium carbonitride layer of $TiC_xN_y$. This layer is deposited by means of the CVD process at a temperature between 1000° C. and 1100° C.

No information is provided for a production by means of the PVD process.

Other examples of coated cutting tools are described, e.g., in U.S. Pat. Nos. 4,490,191; 4,501,786; and 4,341,834.

BRIEF SUMMARY OF THE INVENTION

Based on the above, it is the object of the invention to create a wear-resistant cutting tool, as well as an efficient process for its production.

This object is attained by means of the cutting tool or the cutter plate having a carbonitride coating, optionally containing a group IV metal or aluminum. The cutting tool (1) or cutter plate (3, 4) has a wear-reducing coating, which contains carbonitride ($C_yN_z$) in which the carbon and nitrogen atom form a covalent bond and wherein y/z is preferably at least 2.

The cutting tool is produced by means of a hybrid PVD process wherein the carbon and nitrogen are supplied by gases and not a target. The process for producing a cutting tool or a cutter plate, includes in a first step a basic body is given a desired shape, at least in its areas which are to be coated, including the functionally important edges and surfaces, after which the basic body is subjected to an atmosphere, which is at least partially ionized and contains carbon as well as nitrogen.

DETAILED DESCRIPTION OF THE INVENTION

Figure 1:
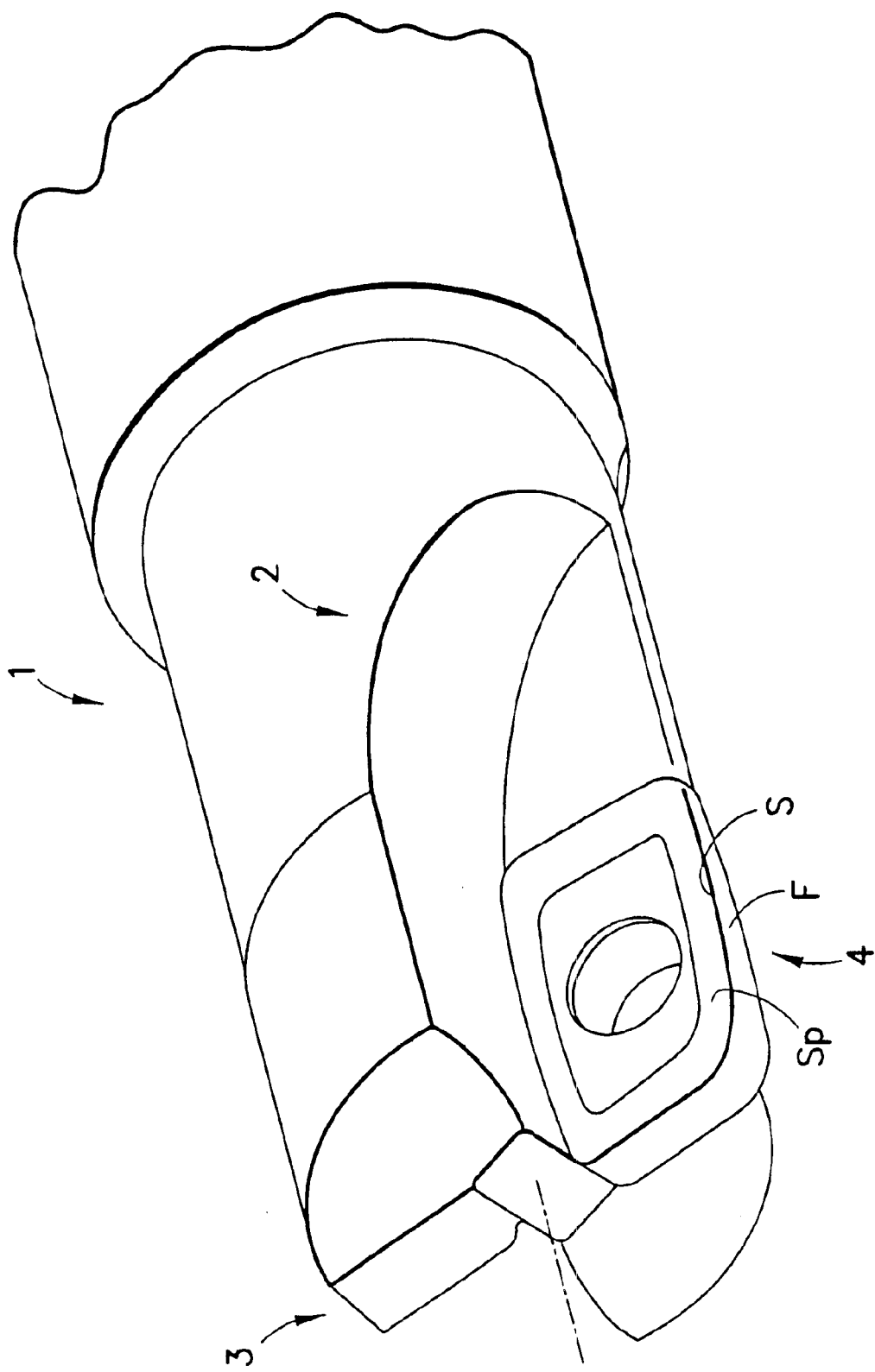
FIG. 1, a cutting tool with coated cutter plates in a perspective simplified representation, FIG. 2, an installation for producing coated cutting tools in a schematic representation, and FIG. 3, a portion of a section through a cutting tool with a coated surface.

The cutting tool of the invention, or the cutter plate suitable for a cutting tool, has a carbonitride layer. This layer is produced close to the surface or at the surface of stressed areas and, if required, also at other areas. The carbonitride layer contains carbon and nitrogen, for example as a compound $C_yN_z$ preferably where y/z is equal to or greater than 2. As a rule, such a carbonitride layer exhibits a relatively low coefficient of friction, which is less than the coefficients of friction of many other known hard material layers and basic materials. The reduced coefficient of friction causes a low wear chip flow. It is possible to increase the cutting output of a cutter plate coated with carbonitride, or a cutting tool coated with carbonitride, in comparison with tools or cutter plates which are uncoated or coated with other materials. The reduced coefficient of friction reduces the tendency of chips to become welded to the respective surface over which they move, for example in the course of processing high-alloy steel, austenitic steel, titanium and light alloys.

Tools coated with carbonitride are particularly suited for processing parts made of titanium or titanium alloys. In comparison with titanium-containing coatings it is possible here to remove or reduce the danger that the surface of titanium parts becomes contaminated with other titanium compounds, which otherwise is often the cause of questions regarding the stability of these parts.

The carbonitride layer can have a hardness which differs from the hardness of the basic material or of layers beneath it, wherein the hardness of the carbonitride layer can either be greater or lesser than the hardness of the layers below it, or that of the basic material of which the tool is formed.

Preferably the carbonitride layer is an $Me_xC_yN_z$:H layer or an $Me_xC_yN_zO_s$:H layer ($x \leq 0.2$, $y/z \geq 2$), wherein the metal Me (which is optional since x can be 0) can be constituted by one or several metals from the fourth group in the periodic system of chemical elements or aluminum or a combination thereof. By metals of the fourth group of the periodic table it is intended to include Si, Ti, Ge, Zr, Sn, Hf and Pb. (When carbon is intended, it is already included in the formula). Preferably these metals are only contained in a low percentage atomic proportion, so that the carbonitride layer essentially is formed from carbon and nitrogen. The small proportion of metals can also be omitted. If required, the metals can be used for specific control of the surface properties. For example, by means of a small amount of titanium it is possible to obtain a structure wherein TiC, TiN or TiCN crystallites are embedded in a CN matrix with a mainly graphitic bonding proportion (covalent bonding).

The carbonitride layer has been found to be particularly wear-reducing if it contains at most 33.3 at % of nitrogen and at least 66.6 at % of carbon (e.g. $C_yN_z$ where $y/z \geq 2$). It has been found that a content of at least 5 at % N provides good results. In this case it can be grown in the form of a polymer structure, for example.

The carbonitride layer preferably is a surface layer, which comes into contact with removed chips and other tool elements or surfaces. It can form a cover layer, and in this way act directly as a wear protection layer. However, if required, a cover layer can also be provided, for example for decorative reasons.

The carbonitride layer can be applied directly to the basic body of cutter material. The basic material from which the body is formed can be a metal, a metal alloy or a ceramic material, as well as of a cermet material (located between the metals and the ceramic material). In this case the hardness of the basic body is combined with the wear-reducing property of the carbonitride coating.

One or several intermediate layers can be optionally formed, arranged between the basic body and the carbonitride layer in order to specifically affect the surface properties. In this case relatively hard intermediate layers, such as TiAlN, TiCN, TiN, $Al_2O_3$ or the like, can be provided. With a multi-layer structure, particularly advantageous results ensue if at least one layer of $Me_x(C, N, O)$ is provided. Again, the metal preferably is a metal from the fourth group in the periodic system of chemical elements or aluminum. In such a multi-layer structure the hardness of this intermediate layer is combined with the wear-resistant properties of the carbonitride layer. It can be sufficient in this case if the carbonitride layer only has a thickness of 0.1 $\mu$m, for example. However, the layer thickness is preferably somewhat greater (advantageously 0.2 $\mu$m up to 10 $\mu$m) in order to maintain the wear protection over a long period of time.

With a multi-layer structure, a total layer thickness of the layers applied to the basic body of between 0.2 $\mu$m and 10 $\mu$m has been shown to be advantageous.

The carbonitride layer can have a metal content, whose concentration decreases toward the outer surface. By means of such a non-homogeneous structure of the carbonitride layer, its properties can be further optimized, in particular in respect to abrasion, wear resistance and a possible effect on the processed material.

Figure 4:
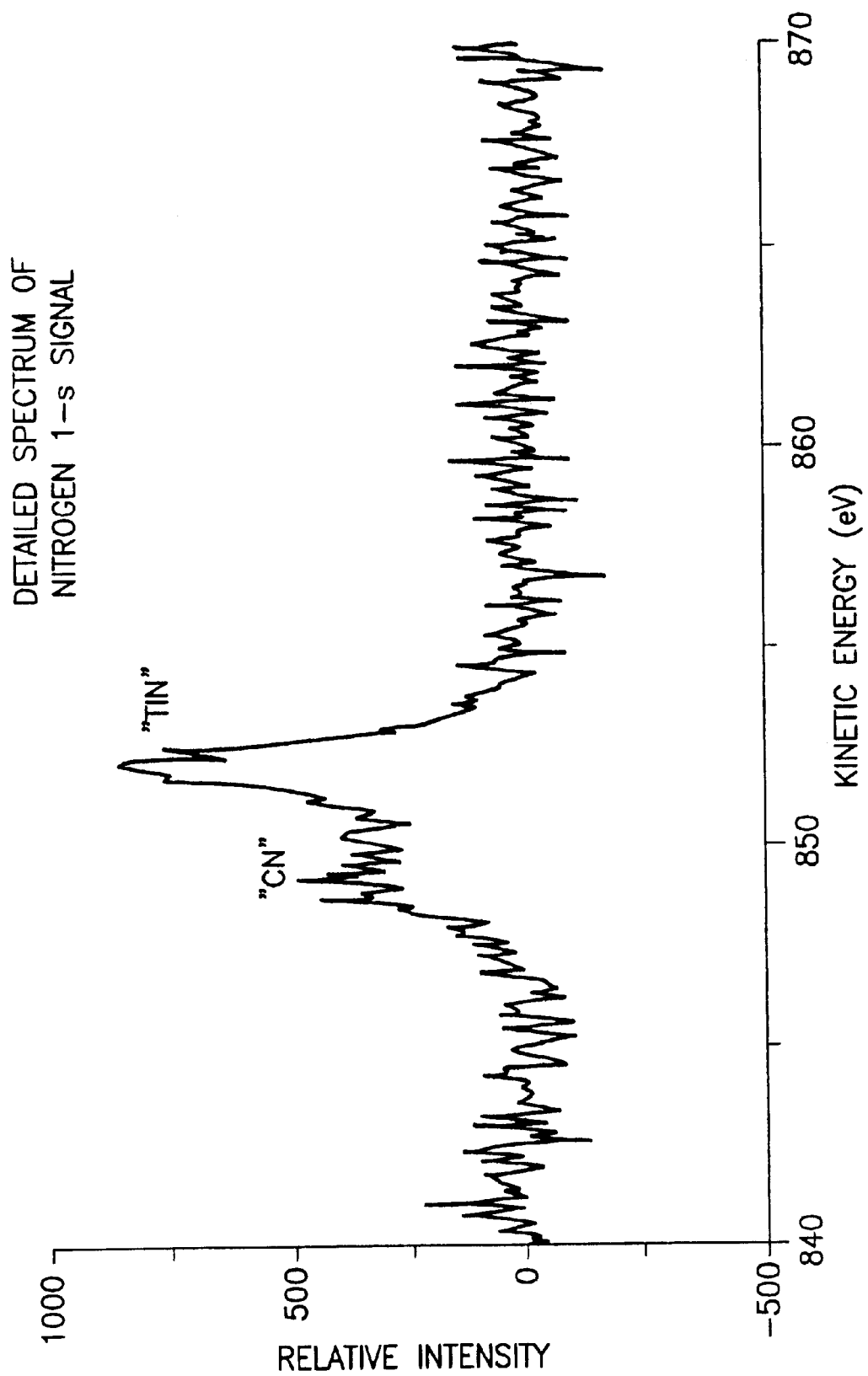
FIG. 4, an XPS detail spectrum of a sample (cutter plate) for nitrogen, coated with the layer of the invention, and FIG. 5, an XPS detail spectrum of a sample (cutter plate) for carbon, coated with the layer of the invention.
Figure 5:
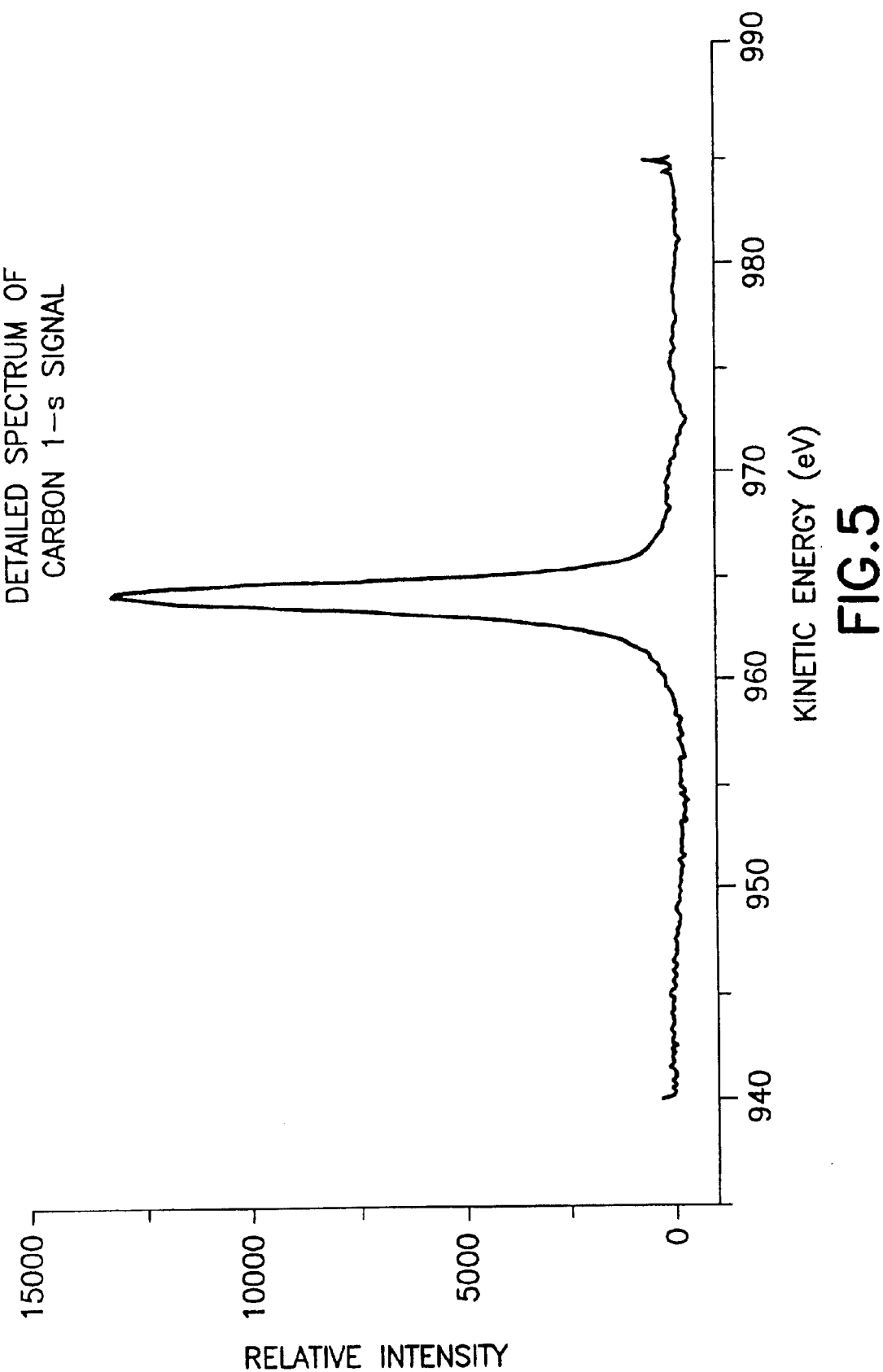

The carbonitride layer can have a crystalline, partially crystalline or amorphous structure. The amorphous structure can be adapted to individual situations of use. Reference is made to FIGS. 4 and 5 regarding possible bonding states.

The cutting tool of the invention is made by a modified PVD (physical vapor deposit) process in accordance with the invention for producing a cutting tool.

PVD processes usually deposit layers, the components thereof come from targets which are first partially vaporized. In contrast thereto, CVD (chemical vapor deposit) processes deposit layers, the components thereof being the results of a chemical reaction of a gas atmosphere which donates the components for forming the layers.

The inventive process is a modified PVD process which is more or less a hybrid process. It is performed within a commonly available PVD apparatus. However, in operation, instead of a vacuum, some gas is introduced into the chamber of the apparatus. The gas is preferably $CH_4$ and/or $C_2H_2$ as a carbon donator. Nitrogen is introduced to supply the nitrogen component. The pressure ranges from $10^{-4}$ to $10^{-2}$ mbar.

The gas flux is, for example, between 10 and 100 sccm (standard cubic centimeters per minute).

In order to perform the hybrid PVD deposition process, ionization of the atmosphere is necessary. This is achieved by using magnetic fields (AC or DC). The strength of the field can be varied as required and may generally be in the range of a little less than one up to several mT (e.g. about ¾ to about 3 or 4 milliTesla) although higher or lower field strength can be used.

The process initially consists of forming or shaping the cutting tool or the cutter plate, and thereafter, at least partial coating the cutter tool or plate with a $C_yN_z$ containing layer. The precipitation of the $C_yN_z$ layer from a low pressure atmosphere, which contains carbon, as well a nitrogen, is preferred. The ionization of this atmosphere, together with a magnetic field, which preferably surrounds the cutting tool, and an electrostatic bias voltage of the surfaces to be coated, makes a dissociation and ionization of the gases and an even coating of the desired surfaces possible. The magnetic field preferably is a D.C. field, which forces the ions and electrons into spiral-shaped paths. The atmosphere of the vacuum chamber is used as the carbon provider, no graphite target is required. The cathode voltage and the magnetic field are selected so that a defined low wear of the cathodes is achieved. The carbon to be precipitated is obtained from the ionization/dissociation in the plasma being formed. All provided ion sources can remain in the vacuum chamber. No additional space for an additional component (carbon source) needs to be made available or freed.

A metal or inert gas ion source can be used as the ion source. Along with the precipitation of the carbonitride layer, the presence of a metal ion source permits the precipitation of a small amount of metal.

Preferably the inventive process is performed in the same reactor chamber in which a usual PVD coating process is performed, for example in forming intermediate layers 5, 6. If, for example, a PVD coating installation with four ion or plasma sources is used for this, the carbonitride cover layer can be applied in the same installation without an additional ion source in that in the last process step a low pressure atmosphere containing carbon and nitrogen is built up, wherein an ion source with a titanium target, for example, is further operated for generating the plasma.

Further details of advantageous embodiments of the invention ensue from the drawings and the description.

Figure 3:
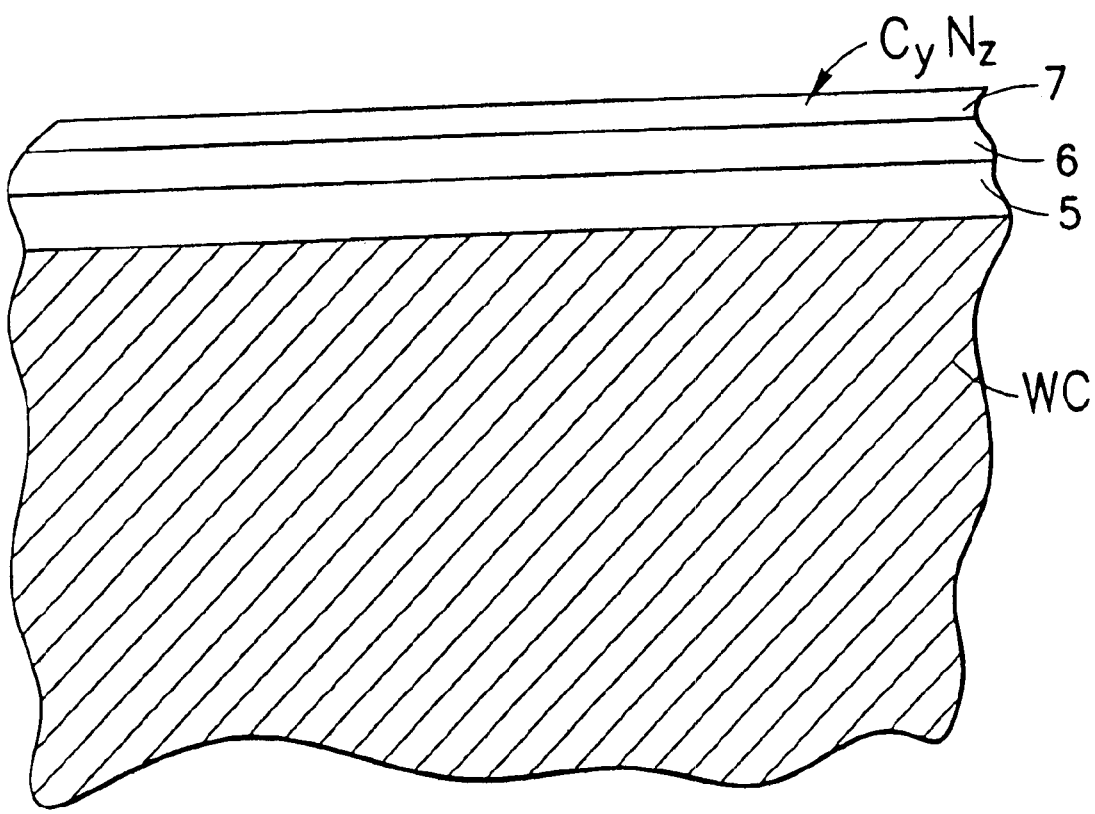

Embodiments of the invention are illustrated with reference to the drawings as follows:

FIG. 1 shows a cutting tool 1, which has a tool body 2 and cutter plates 3, 4 maintained thereon. The cutter plates 3, 4 are designed in the same way, and each has a basic body made of a hard metal (cermet), such as tungsten carbide, for example. The cutter plates 3, 4 are provided with a coating such as shown in FIG. 3. Several layers 5, 6, 7 have been placed on the basic or substrate body made of tungsten carbide WC. In this case, the layer 7 constitutes the outer cover layer. It is a carbonitride layer $C_yN_z$ of a thickness of approximately 0.1 $\mu$m. In addition to carbon and nitrogen, the cover layer 7 can also contain metal and hydrogen. The layer 7 ($Me_xC_yN_z$:H) is a wear-protection layer which has a low coefficient of friction in comparison with customary materials such as, for example, aluminum, other light metal alloys, titanium, or also plastic materials, as well as different types of steel, in particular austenitic steel or high-alloy steel. The amount of metal Me can be varied for affecting the layer properties. Efforts are made so that the average metal content does not exceed 10 at % and preferably below 5 at %. Titanium, zirconium, aluminum and similar metals are usable. The carbon content measured in atomic percent preferably is greater than the nitrogen content measured in atomic percent, most preferably $y/z \geq 2$.

At least one of the intermediate layers 5, 6 below the carbonitride layer can additionally contain oxygen to form a layer made of $Me_x(C, N, O)$, wherein $Me_x$ represents one or several metals selected from aluminum and group IV metals (excluding carbon). In the preferred embodiments, the oxygen is less than 20 at %. Also, in the preferred embodiment, one or more intermediate layers are composed of $Me_x(C_yN_zO_s)$ where y/z is equal to or less than 2, the oxygen content is less than 20 at % and the average metal content does not exceed 1 at % and is more preferably below 5 at %.

A cutting tool of this type has been shown to be extremely wear-resistant. The tendency to become welded and the surface wear in the immediate vicinity of the cutting edge in particular are low. Coated surface areas are represented in FIG. 1, in particular the chip surface Sp adjoining the cutting edge S, and the free surface F. In the simplest case the cutter plate 3, 4 is completely coated.

Figure 2:
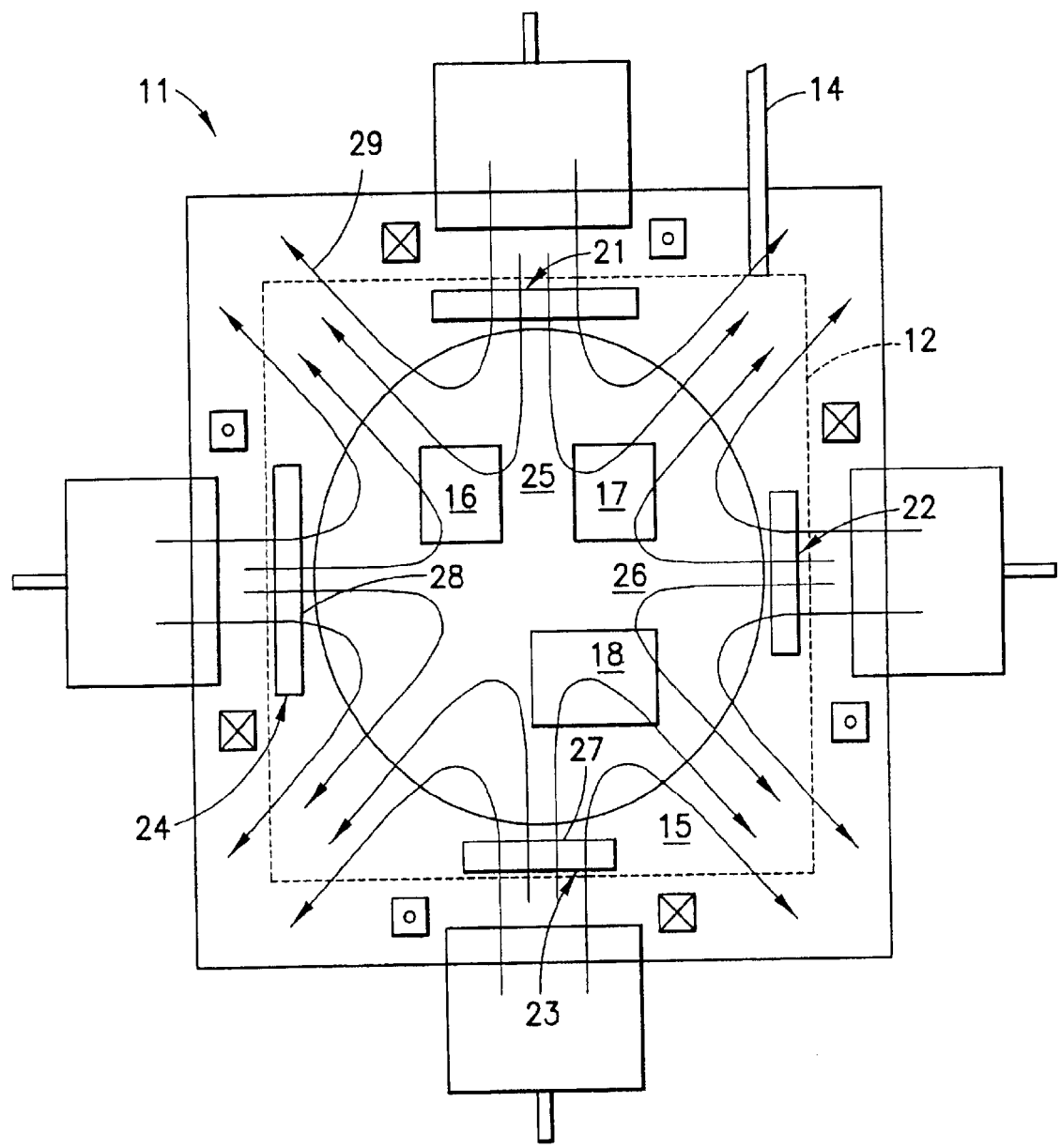

The following procedure can be employed for producing the coating:

Coating is performed in accordance with a modified PVD process in an installation 11 schematically represented in FIG. 2. It has a reaction chamber 12, which can be hermetically sealed to the exterior. A vacuum can be generated in the reaction chamber 12, wherein gases can be introduced into the interior chamber 15 in a defined manner via an inflow line 14 schematically represented in FIG. 2. One or several holders 16, 17, 18 for cutting tools, cutter plates, or cutting tool or cutter plate supports are arranged in the interior chamber. Four ion sources 21, 22, 23, 24 are furthermore arranged in the interior chamber 15, which can be evacuated, each of which has a target, for example a metallic target 25, 26, 27, 28 (each in the shape of a plate, for example). The targets 25 to 28 are the targets required for producing the layer 5, 6 located underneath the cover layer 7. No further locations for arranging such ion sources are provided. The targets 25 to 28 constitute cathodes. A plasma is generated in the interior chamber, from which the ions impinge on the targets and remove metal ions to be precipitated on the cutter plates. The holders 16, 17, 18 can be provided with a bias voltage for controlling the precipitation. It is moreover possible to build up a magnetic field 29, which surrounds the parts to be coated in a ring shape. This is preferably generated by means of coils with radially oriented coil axes and excitation in the same direction.

For building up the desired layers, the cutting tools or cutter plates are first brought into the interior chamber 15 and deposited on the holders 16, 17, 18. The interior chamber 15 is subsequently evacuated and filled with an inert gas under very low pressure, for example. By means of an appropriate control of the ion sources it is now possible to produce the layer 5 and 6 by means of PVD coating processes known per se. If required, the layers 5, 6 can also be applied by means of a CVD process or in other ways.

After coatings 5 and 6 have been applied, a modified PVD coating process is performed to apply layer 7. This is preferably done in the same apparatus. Rather than a vacuum, a gas containing carbon and nitrogen is introduced into the interior chamber 15 through the inflow line 14. Preferably the carbon donor gas is $CH_4$ and/or $C_2H_2$ and the nitrogen containing gas is nitrogen ($N_2$). The pressure is low and preferably ranges from $10^{-4}$ to $10^{-2}$ mbar. The gas flow is typically 10 to 100 sccm (standard cubic centimeters per minute). One or several ion sources can be continued in operation to cause the ionization of the gas and plasma formation.

With an appropriate bias voltage and an appropriate magnetic field, the desired $C_yN_z$ layers (where y/z is preferably $\geq 2$) are precipitated on the cutting tools or cutter plates from the plasma being formed. A chemical equilibrium is not established.

The coating installation can also operate with only one of the described ion sources. Other components suitable for precipitation can be employed in place of the other ion sources.

$C_yN_z$ cover layers, which can provide a considerable reduction of the wear of the cutting tools, and therefore an increase of the cutting output, can thereby be created by PVD coating processes modified as described above, in conventional coating installations, without major modification of the conventional apparatus.

FIG. 4 represents an XPS detail spectrum obtained by exposing the cutter plate 4, i.e. in particular the cover layer 7 thereof, to Mg k α X-ray radiation. (Magnesium decelerating electrode, k-shell, α-transition). The intensity is based on a count of electrons, the absolute value of which depends on the sensor used. Thus, the units are arbitrary but show relative values.

The secondary electrons, which were obtained by the excitation of the 1s shell of the contained nitrogen, have a kinetic energy of between 848 eV and 850 eV. The N 1s peak of the nitrogen obtained is to be associated with a CN bond and is located approximately 3 eV away from the adjoining 1s peak, which is to be associated with the TiN bond.

FIG. 5 shows an XPS detail spectrum of the sample by means of Mg k α X-ray radiation. The layer 7, which was ion-etched to remove all surface contamination, shows a distinctive C 1s peak. The carbon is therefore present as a graphitic matrix. No clear signal for carbon in CN bonds can be seen in FIG. 5 because of the great signal strength of the C 1s signal for C—C bonds.

A cutting tool is provided, at least in certain areas, with a carbonitride coating, which acts to reduce friction and as a wear-protective layer. The coating is applied by means of a modified PVD process in that, for creating the carbonitride layer, carbon and nitrogen in the form of gas are introduced into the reaction chamber, and one or several ion sources are continued to be operated to form plasma.

It will be appreciated that the instant specification is set forth by way of illustration and not limitation and that various modifications and changes may be made without departing from the spirit and scope of the present invention.

What is claimed is:

1. A cutting tool (1) or cutter plate (3, 4) with a wear-reducing coating, said coating including a layer which contains carbonitride wherein the carbon to nitrogen ratio is defined by the following ($C_yN_2$) where y/z $\geq$ 2, and wherein covalent bonds are formed; and said carbonitride containing layer comprising at least 5 at % N; said layer optionally containing metal Me wherein the metal Me is one or several metals from group IV of the periodic system of chemical elements or aluminum and the Me content does not exceed 10 at %.

2. The cutting tool or cutter plate of claim 1, wherein said covalent bonds in the carbonitride containing layer of the coating are bonds which when irradiated with Mg k α X-ray radiation, emit secondary electrons of a kinetic energy between 848 and 850 eV.

3. The cutting tool or cutter plate of claim 1, wherein the carbonitride containing layer is a $Me_xC_yN_zO_s$:H layer, wherein the metal Me is one or several metals from the group IV of the periodic system of chemical elements or aluminum, wherein the oxygen content is less than 20 at %; the Me content does not exceed 10 at %; y/z $\geq$ 2; and wherein the layer contains different phases (multi-phase structure of different crystallites).

4. The cutting tool of claim 3 wherein Me is titanium, zirconium or aluminum.

5. The cutting tool or cutter plate of claim 4, wherein the metal content (Me) is at most 5 at %.

6. The cutting tool or cutter plate of claim 1, wherein the carbonitride layer is a surface layer.

7. The cutting tool or cutter plate of claim 1, wherein the carbonitride layer has been applied to a basic body of cutting material, which consists of a metal, a metal alloy, hard alloy or a ceramic material.

8. The cutting tool or cutter plate of claim 7, wherein a one- or multi-layer intermediate layer is arranged between the basic body of cutting metal and the carbonitride layer, said intermediate layer optionally containing one or several substances selected from the group consisting of TiAlN, TiCN, TiN, ZrN and $Al_2O_3$.

9. The cutting tool or cutter plate of claim 8, wherein the total layer thickness of the wear reducing coating carbonitride layer and intermediate layer or layers is 0.2 µm to 10 µm.

10. The cutting tool or cutter plate of claim 1, comprising at least one layer consisting essentially of TiCN, TiAlCN or TiAlN is arranged between the basic body of cutting metal and the wear reducing coating carbonitride layer.

11. The cutting tool or cutter plate of claim 1, wherein the wear reducing coating carbonitride layer has a thickness of at least 0.1 µm.

12. The cutting tool or cutter plate of claim 11, wherein the thickness is 0.2 µm to 10 µm.

13. The cutting tool or cutter plate of claim 1, wherein the wear resistant carbonitride layer has a metal content distributed so that the amount of metal in the layer decreases from a bonded side of the carbonitride layer toward an unbonded surface of the carbonitride layer.

14. The cutting tool or cutter plate of claim 13, wherein on the bonded side facing away from the unbonded surface, the carbonitride layer has a metal content of maximally 50 at %, which diminishes toward the surface.

15. The cutting tool or cutter plate of claim 1, wherein the carbonitride layer is a crystalline layer.

16. The cutting tool or cutter plate of claim 1, wherein the carbonitride layer is an amorphous layer.

17. The cutting tool or cutter plate of claim 1, further comprising a cover layer applied to the carbonitride layer.

* * * * *

UNITED STATES PATENT AND TRADEMARK OFFICE
CERTIFICATE OF CORRECTION

PATENT NO.   : 6,617,058 B2    Page 1 of 1
DATED        : September 9, 2003
INVENTOR(S)  : Veit Schier It is certified that error appears in the above-identified patent and that said Letters Patent is hereby corrected as shown below:

Title page,
Item [*] Notice, delete "0 days" and replace with -- 71 days --.
Item [56], References Cited, U.S. PATENT DOCUMENTS, insert:
-- 5,840,435      11/1998        Lieber et al.
   5,650,201       7/1997        Tompa
   4,490,191      12/1984        Hale
   4,501,786       2/1985        Hale
   4,341,834       7/1982        Kikuchi et al. --.
FOREIGN PATENT DOCUMENTS, insert:
-- WO 95/02709       1/1995
   EP  0 736 615 A2  10/1996
   EP  0 980 917 A2   2/2000
   WO 99 23275 A      5/1999
   JP  8-27562        1/1996
   JP  8-20871        1/1996 --.
OTHER PUBLICATIONS, insert:
-- DATABASE WPI, Section CH, Week 197913, Derwent Publications, Ltd., London, GB; Class L02, AN 1979-24767B, XP002188606 of JP 54 023608 A (SUMITOMO ELECTRIC IND. CO.), 22 February 1979;
PATENT ABSTRACTS OF JAPAN, Vol. 1996, No. 05, 31 May 1996 of JP 08 020871 A (TOSHIBA TUNGALOY CO. LTD.), 23 January 1996;
PATENT ABSTRACTS OF JAPAN, Vol. 1996, No. 05, 31 May 1996 of JP 08 027562 A (TOSHIBA TUNGALOY CO. LTD.), 30 January 1996 --.

Signed and Sealed this

Twenty-seventh Day of December, 2005

JON W. DUDAS
*Director of the United States Patent and Trademark Office*